United States Patent [19]

Morikawa et al.

[11] Patent Number: 5,318,744
[45] Date of Patent: Jun. 7, 1994

[54] PROCESS FOR PRODUCING CERAMIC SINTERED BODY HAVING METALLIZED VIA HOLE

[75] Inventors: Asao Morikawa; Kazuo Kondo, both of Aichi, Japan

[73] Assignee: NGK Spark Plug Co., Ltd., Aichi, Japan

[21] Appl. No.: 926,654

[22] Filed: Aug. 10, 1992

[30] Foreign Application Priority Data

Aug. 27, 1991 [JP] Japan .................................. 3-240474

[51] Int. Cl.$^5$ ............................. B22F 1/00; B22F 7/00
[52] U.S. Cl. .................................................... 419/53
[58] Field of Search ............................................. 419/53

[56] References Cited

U.S. PATENT DOCUMENTS 4,671,928  6/1987  Herron et al. ......................... 419/10
5,011,655  4/1991  Mankins ................................. 419/8
5,124,118  6/1992  Youssef et al. ......................... 419/9

Primary Examiner—Peter A. Nelson
Attorney, Agent, or Firm—Sughrue, Mion, Zinn, Macpeak & Seas

[57] ABSTRACT

A process for producing a ceramic sintered body having a metallized via hole previously formed after lamination of the ceramics is disclosed and said process comprises immersing in a first liquid a ceramic semi-sintered body formed through heating at 500 to 900° C. and having a large number of pores and a straight via hole, thereby to allow the first liquid to penetrate into the pores of the semi-sintered body, subsequently immersing the resulting semi-sintered body in a suspension of electrically conductive powder particles having an average particle size of 2 to 3 μm in a second liquid incompatible with the first liquid, thereby to fill the via hole with the suspension, and then sintering the resulting semi-sintered body in a non-oxidizing atmosphere.

2 Claims, No Drawings

PROCESS FOR PRODUCING CERAMIC SINTERED BODY HAVING METALLIZED VIA HOLE

FIELD OF THE INVENTION

The present invention relates to a process for producing a ceramic sintered body having a metallized via hole. More particularly, the present invention relates to a process in which a straight via hole of a semi-sintered body can be exclusively filled with a suspension for metallization and which can produce, without the necessity of strictly regulating sintering conditions, a metallized via hole-possessing ceramic sintered body having excellent electrical conductivity and hermeticity.

The process of the present invention can be utilized for the manufacture of, for example, LSI-supporting ceramic substrates in which electrical connection between the LSI and an external circuit is established through the medium of a metallic filling material filled in a via hole formed in the substrate.

BACKGROUND OF THE INVENTION

In a known process for producing a ceramic sintered body having a metallized via hole, specifically a Cu-metallized glass ceramic substrate, for example, CuO, Cu, a mixture of CuO and Cu, or a mixture of CuO and $Cu_2O$ is used as a raw material for Cu metallization. A green sheet is first sintered in the air to burn and remove an organic binder contained in the green sheet, followed by reductive sintering for reducing the CuO to Cu and then by sintering in a neutral atmosphere.

Further, a known process for producing a ceramic substrate having a straight via hole comprises punching via holes in green sheets, filling the via holes with a Cu paste, laminating a predetermined number of green sheets, and sintering the laminated sheets to produce a substrate having a predetermined thickness.

However, the former of the above-described two processes has had a drawback that since the oxidation and reduction of Cu results in fluctuations in the volume of the metallic filling material and this leads to cracking of the ceramic or the filling material, the raw material powder for metallization should be prepared by blending powders having proper particle sizes or various additives should be incorporated into the raw material powder.

The latter process, on the other hand, has had a problem that in laminating the sheets, it is difficult to position the sheets in such a manner that opposed via holes are precisely joined together and a problem that the metallic filling material formed from the Cu paste is apt to have impaired electrical conductivity at interfaces between sheets. Furthermore, there has been a problem that the amount of the Cu paste with which the via holes are to be filled should be regulated because too large amounts thereof result in cracking of the ceramic due to a volume increase of the filling material caused by Cu oxidation during binder-removing sintering, while too small amounts thereof result in diminished hermeticity or impaired electrical conductivity.

The present inventors have conducted extensive studies in regard to processes for producing a ceramic sintered body having a metallized via hole. As a result, it has been found that the above-described drawbacks of the prior art techniques can be eliminated by using a semi-sintered body having a via hole and filling only the via hole with a suspension for metallization without allowing the suspension to penetrate into pores of the semi-sintered body. The present invention has been completed based on this finding.

SUMMARY OF THE INVENTION

An object of the present invention is to provide a process for producing a ceramic sintered body having a metallized via hole in which process only a straight via hole of a semi-sintered body is selectively filled with a suspension for metallization and which can, thereby, produce a metallized via hole-possessing ceramic sintered body having excellent electrical conductivity and hermeticity without the necessity of strictly regulating sintering conditions, thus overcoming the drawbacks described above.

The process of the present invention for producing a ceramic sintered body having a metallized via hole comprises immersing in a first liquid a ceramic semi-sintered body formed, heating at a temperature of from 500 to 900° C. to form a semi-sintered body having a large number of pores and a straight via hole, thereby to allow the first liquid to penetrate into the pores of the semi-sintered body, subsequently immersing the resulting semi-sintered body in a suspension of electrically conductive powder particles in a second liquid incompatible with the first liquid, thereby to fill the via hole with the suspension, and then sintering the resulting semi-sintered body in a non-oxidizing atmosphere.

DETAILED DESCRIPTION OF THE INVENTION

In the present invention, the term "straight via hole" means a via hole which extends straight and has no curved part and which can be filled with a suspension for metallization by immersion of the ceramic semi-sintered body in the suspension. The "ceramic semi-sintered body" means a so-called calcined body from which a resinous ingredient as a binder has been removed and which is a porous body having a moderate amount of pores and having a mechanical strength sufficient to withstand the subsequent immersion steps. In forming said semi-sintered body having porosity of 10 to 60%, heating at 500 to 900° C. is necessary. If the heating temperature is below 500° C, there are cases where resin removal (binder removal) is insufficiently conducted or the resulting semi-sintered body comes to have a mechanical strength insufficient to withstand the subsequent steps. A porosity is evaluated by an equation $(W_3-W_1)/(W_3-W_2)$ (wherein $W_1$ is a weight of ceramics in dry state, $W_2$ is weight of the ceramics absorbed water and $W_3$ is weight of ceramics in a water). If the heating temperature exceeds 900° C., there are cases where the heating does not produce pores in a final sintering or the adhesion between the substrate and the metallic filling material in the via hole cannot be taken place to a sufficient level even after the final sintering. The first liquid is impregnated into a surface of the bore hole in certain extent to protect penetrating the electrically conductive powder particle into a substrate, however, a slight penetration of the electrically conductive particle may be permissible since a mechanically intimate contact and excellent hermeticity between the powder particle and the ceramic substrate is formed, unless deteriorate electric insulation.

The second liquid is one which is incompatible with the first liquid. The term "incompatible" herein means that either of the two liquids hardly dissolves in the other. For example, as the first and second liquid, a combination of (A) water and (B) xylene, toluene, benzene, α-terpineol, 2-butanol, or the like may be used; the first liquid may be either of (A) and (B). When the second liquid (B) is used as the first liquid, a vaporizing rate of the liquid (B) should be equal or smaller than that of the first liquid (A) so as to prohibit vaporizing the second liquid (B) before immersing the substrate into the first liquid (A) containing electrically conductive powder particle. Further, the term "non-oxidizing atmosphere" means a neutral or reducing atmosphere.

In a preferred embodiment of the present invention, the first liquid is water, and the suspension comprises either a combination of a hydrocarbon (e.g., toluene or xylene) having a boiling point of from 80 to 120° C. as the second liquid and powder particles of Cu having a particle size of 0.3 to 5 μm or a combination of such hydrocarbon, powder particles of Cu, and optionally with a sublimable resinous ingredient (e.g., camphor).

The ceramic semi-sintered body used in the present invention is porous and has a large number of pores. Therefore, if this semi-sintered body is immersed directly in a suspension of electrically conductive powder particles, the suspension disadvantageously penetrates into not only the via holes but also these pores and, hence, the resulting semi-sintered body will assume the color of copper upon sintering and the thus-obtained sintered body has a problem that insulation between adjacent via holes becomes insufficient.

In contrast, according to the process of the present invention, the semi-sintered body is first immersed in a first liquid to thereby allow the first liquid to penetrate into the pores of the semi-sintered body, and the resulting semi-sintered body is then immersed in a suspension of electrically conductive powder particles in a second liquid incompatible with the first liquid. Due to such procedures, the suspension can be selectively introduced into the via holes of the semi-sintered body, so that the via holes only are filled with the suspension exclusively and penetration of the suspension into the pores is avoided. Because of this, the ceramic sintered body obtained by the process of the present invention not only has excellent electrical conductivity and hermeticity, but also is excellent in insulation between adjacent metallized via holes.

Another feature of the process of the present invention resides in that a semi-sintered body, i.e., so-called calcined body, is used as the ceramic body to be immersed in the suspension, and this semi-sintered body contains almost no (or perfectly no) resinous ingredients. Therefore, there is no fear that a carbon residue resulting from insufficient resin removal may remain in the sintered body obtained after the final step of sintering. In addition, since there is no need of heating the semi-sintered body in an oxidizing atmosphere for resin removal, the process is free from the troublesome procedures for the prevention of conductive material oxidation and for the reduction of an oxidized conductive material.

Furthermore, since in the present invention, straight via holes are formed after green sheets have been laminated together, there is no need of laminating green sheets having via holes filled with a Cu paste in such a manner that opposed via holes are precisely joined together and of sintering the thus-laminated sheets as in a conventional process. Therefore, the process of the present invention is completely free from the fear of producing a metallized via hole-possessing sintered body in which the metallized via holes do not extend straight or the metallic filling material has impaired electrical conductivity at interfaces between sheets.

In particular, in the case where the suspension used in the process of the present invention comprises a hydrocarbon having a boiling point of from 80 to 120° C. as the second liquid and powder particles of Cu or comprises the above two ingredients and optionally with a sublimable resinous ingredient, the metallic filling material to be formed in the via holes of the ceramic semi-sintered body does never contain an organic residue such as carbon because the ingredient(s) other than Cu can be completely removed with ease. Therefore, the metallic filling material in the ceramic sintered body obtained by the process of the present invention is of excellent quality.

The present invention will be explained in more detail with reference to the following example, but the invention is not construed as being limited thereto. Unless otherwise specified, weight, rats and percent are by weight.

EXAMPLE

Green sheets (100 m × 100 mm × 1.0–1.4 mm (t)) were laminated and straight via holes were punched in the laminated green sheets in predetermined positions. The diameter and interval of the via holes were 0.25 mm and 0.6 mm, respectively, or 0.1 mm and 0.45 mm, respectively, in terms of dimensions after sintering.

The green sheets used above had been produced by the following method. First, predetermined amounts of ZnO, MgCO$_3$, Al(OH)$_3$, SiO$_2$, H$_3$BO$_3$, and H$_3$PO$_4$ as raw materials for the green sheets which comprises 4% ZnO, 13% MgO, 23% Al$_2$O$_3$, 58% SiO$_2$, 1% B$_2$O$_3$ and 1% ZrO$_2$ were mixed by means of a planetary mill, and the mixture is melted in a platinum or alumina crucible at a temperature between 1,400 and 1,500° C. so as to be in flowable state. This melt was poured into water thereby to quench and vitrify it. The vitrification product was then pulverized in an alumina-ball mill to prepare a frit (glass powder) having an average particle diameter of from 2 to 3 μm.

Using this powder along with poly(vinyl butyral) and a plasticizer (diethylene glycol), green sheets having a desired predetermined size, conventionally 0.2 to 1.0 mm in thickness, were formed by the doctor blade method in an ordinary way.

After the thus-obtained green sheets were laminated and straight via holes were punched therein as described hereinabove, the laminated green sheets were cut into blocks. The blocks were calcined in the air at a temperature of from 700 to 900° C. to burn and remove the organic binder, thereby producing porous semi-sintered bodies (porosity; 25%) having a satisfactory mechanical strength and via holes. The semi-sintered bodies were then immersed in water (preferably pure water) as a first liquid, thereby allowing the water to penetrate into the pores of the semi-sintered bodies.

On the other hand, a suspension was prepared which comprises of 100 parts by weight of powder particles of Cu (0.5–5 μm) as electrically conductive powder particles, from 5 to 10 parts by weight of xylene as a second liquid, and from 0 to 8 parts by weight of camphor resin. The above-obtained semi-sintered bodies impregnated with water were immersed in this suspension, thereby allowing the suspension (i.e., Cu powder particles) to penetrate into and fill the via holes and thus forming Cu particle-packed holes to be conductive paths. During this immersion, the suspension may be pressurized to promote penetration of the suspension into the via holes. After being immersed in the Cu suspension, the resulting semi-sintered bodies were polished with a polishing paper to remove the suspension adherent to the surfaces of the semi-sintered bodies, subsequently dried at a temperature of 60 to 120° C. to remove all of the water, xylene, and camphor by evaporation or sublimation, and then sintered in a non-oxidizing (nitrogen gas) atmosphere at a temperature of from 900 to 1,100° C.

Since the above process involved a calcining step, the organic resinous ingredient was able to be removed almost completely and the metallic filling material packed in the via holes in the final ceramic sintered bodies contained almost no carbon residue. This was ascertained by infrared absorption spectroscopy. Further, since the suspension was prevented from penetrating into the pores of the semi-sintered bodies, the ceramic sintered bodies did not assume the color of Cu. One of the ceramic sintered bodies obtained above was tested for insulation between metallized via holes and, as a result, the resistivities were $25 \times 10^5$ M$\Omega$ and $25 \times 10^5$ M$\Omega$ (measured at two points in one sintered body), showing that the metallized via holes were well insulated from each other. In this test, "Super Megohmmeter Model SM-9E" manufactured by Toa Electronics Ltd., Japan was used as the resistivity-measuring device at an applied voltage of 250 V, and the ceramic sintered body sample evaluated had a via hole diameter of 0.25 mm, via hole interval of 0.6 mm, and plate thickness of 1.0 mm.

For the purpose of comparison, a sintered body was produced in the same manner as the above except that use of water as the first liquid was omitted and the semi-sintered body was immersed directly in the suspension described above. The whole of this comparative sintered body slightly colored the color of Cu upon sintering. The comparative sintered body was tested for resistivity between metallized via holes in the same manner as the above and, as a result, the resistivities were $2 \times 10^5$ M$\Omega$ and $5 \times 10^5$ M$\Omega$, showing that the insulation between metallized via holes was slightly insufficient.

A ceramic sintered body according to the present invention which had a plate thickness of 1 mm and a via hole diameter of 0.25 mm and a ceramic sintered body according to the present invention which had a plate thickness of 0.6 mm and a via hole diameter of 0.1 mm were thus produced and these were examined for hermeticity and for the electrical conductivity of each metallized via hole. As a result, both samples showed good hermeticity, with the air permeabilities therefor being $3 \times 10^{-8}$ std cc/sec or less. The electrical conductivity was evaluated in terms of reject ratio (R = number of rejects / total number of metallized via holes) and, as a result, the reject ratio for the former sample was 0/176 and that for the latter was 0/544, showing that both samples had good metallized via hole conductivity.

While the invention has been described in detail and with reference to specific embodiments thereof, it will be apparent to one skilled in the art that various changes and modifications can be made therein according to particular use of the product to be produced, without departing from the spirit and scope thereof. For example, the opening size, number, and opening shape of straight via holes formed by punching, whether green sheets are laminated or not, the number of green sheets to be laminated, the thickness of the sheets, etc. are not particularly limited.

As ceramic materials for the ceramic sintered body, alumina, mullite, AlN, $Si_3N_4$, and the like may be used besides those mentioned hereinabove. As electrically conductive powders, an Mo powder, W powder, Ni powder, Ag powder, Pd powder, and the like may be used besides the above-mentioned one.

As described above, according to the process of the present invention, a metallized via hole-possessing ceramic sintered body having excellent electrical conductivity and hermeticity can be produced without the necessity of strictly regulating sintering conditions and without the fear that due to the oxidation and reduction of Cu, the metallized via holes may have impaired electrical conductivity or the ceramic body may develop cracks. Therefore, the process of the present invention can easily attain a diminution in rejected product production, increase in yield, and improvement in product quality.

What is claimed is:

1. A process for producing a ceramic sintered body having a metallized via hole previously formed after lamination of the ceramics which comprises immersing in a first liquid a ceramic semi-sintered body formed through heating at 500 to 900° C. and having a large number of pores and a straight via hole, thereby to allow the first liquid to penetrate into the pores of the semi-sintered body, subsequently immersing the resulting semi-sintered body in a suspension of electrically conductive powder particles having an average particle size of 2 to 3 $\mu$m in a second liquid incompatible with the first liquid, thereby to fill the via hole with the suspension, and then sintering the resulting semi-sintered body in a non-oxidizing atmosphere.

2. A process as claimed in claim 1, wherein said first liquid is water, and said suspension comprises a hydrocarbon having a boiling point of from 80 to 120° C. as said second liquid and powder particles of Cu and may further contain a sublimable resinous ingredient.

* * * * *